US011889214B2

(12) United States Patent
Ogura et al.

(10) Patent No.: US 11,889,214 B2
(45) Date of Patent: Jan. 30, 2024

(54) IMAGE SENSOR AND IMAGING DEVICE

(71) Applicant: NIKON CORPORATION, Tokyo (JP)

(72) Inventors: Daiki Ogura, Tokyo (JP); Masahiro Juen, Yokohama (JP); Tomoki Hirata, Tokyo (JP); Shigeru Matsumoto, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 603 days.

(21) Appl. No.: 17/043,160

(22) PCT Filed: Mar. 29, 2019

(86) PCT No.: PCT/JP2019/014350
§ 371 (c)(1),
(2) Date: Mar. 31, 2021

(87) PCT Pub. No.: WO2019/189892
PCT Pub. Date: Oct. 3, 2019

(65) Prior Publication Data
US 2021/0227164 A1 Jul. 22, 2021

(30) Foreign Application Priority Data
Mar. 30, 2018 (JP) .................. 2018-067700

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H01L 27/14621* (2013.01);
(Continued)

(58) Field of Classification Search
CPC .... H04N 25/75; H04N 25/704; H04N 25/772; H04N 25/134; H01L 27/14612;
(Continued)

(56) References Cited

U.S. PATENT DOCUMENTS 7,081,608 B2\* 7/2006 Bock .................... H04N 25/616
250/214 R
2013/0214128 A1 8/2013 Yamashita et al.
(Continued)

FOREIGN PATENT DOCUMENTS

JP 2013-172210 A 9/2013
JP 2013-255188 A 12/2013
(Continued)

OTHER PUBLICATIONS

Jun. 18, 2019 International Search Report issued in International Patent Application No. PCT/JP2019/014350.
(Continued)

*Primary Examiner* — Gevell V Selby
(74) *Attorney, Agent, or Firm* — Oliff PLC

(57) ABSTRACT

An image sensor, includes: a first pixel and a second pixel, in a first direction, each including a first photoelectric conversion unit and a light-shielding unit and outputting a signal; a third pixel and a fourth pixel, in the first direction, each including a second photoelectric conversion unit and outputting a signal; a first signal line and a second signal line, in the first direction, each of which can be connected to the first pixel, the second pixel, the third pixel and the fourth pixel; and a control unit that performs a first control in which a signal of the first pixel is output to the first signal line and a signal of the second pixel is output to the second signal line, and a second control in which a signal of the third pixel and a signal of the fourth pixel are output to the first signal line.

20 Claims, 11 Drawing Sheets

(51) Int. Cl.
*H04N 25/704* (2023.01)
*H04N 25/772* (2023.01)

(52) U.S. Cl.
CPC .. *H01L 27/14623* (2013.01); *H01L 27/14636* (2013.01); *H04N 25/704* (2023.01); *H04N 25/772* (2023.01)

(58) Field of Classification Search
CPC ......... H01L 27/14621; H01L 27/14623; H01L 27/14636
See application file for complete search history.

(56) References Cited

U.S. PATENT DOCUMENTS

| 2016/0141326 | A1  | 5/2016 | Hanzawa |
| 2017/0041563 | A1  | 2/2017 | Suzuki |
| 2017/0155863 | A1* | 6/2017 | Shikina ................. H04N 25/70 |
| 2018/0091755 | A1* | 3/2018 | Kim ..................... H04N 25/533 |

FOREIGN PATENT DOCUMENTS

| JP | 2015-177429 A | 10/2015 |
| JP | 2017-034606 A | 2/2017 |

OTHER PUBLICATIONS

Nov. 9, 2021 Office Action issued in Japanese Patent Application No. 2020-509362.
Dec. 12, 2023 Office Action issued in Japanese Patent Application No. 2022-176227.

* cited by examiner

IMAGE SENSOR AND IMAGING DEVICE

TECHNICAL FIELD

The present invention relates to an image sensor and an imaging device.

BACKGROUND ART

An image sensor that reads out a focus detection signal and an image signal is known (for example, Patent Literature 1: PTL 1). In such image sensor, it is desired to speed up signal reading.

CITATION LIST

Patent Literature

PTL 1: Japanese Laid-Open Patent Publication No. 2017-34606

SUMMARY OF INVENTION

According to the 1st aspect of the invention, an image sensor, comprises: a first pixel and a second pixel, provided in a first direction, each including a first photoelectric conversion unit that photoelectrically converts light to generate an electric charge and a light-shielding unit that shields a part of light incident to the first photoelectric conversion unit and outputting a signal based on the electric charge generated by the first photoelectric conversion unit; a third pixel and a fourth pixel, provided in the first direction, each including a second photoelectric conversion unit that photoelectrically converts light to generate an electric charge and outputting a signal based on the electric charge generated by the second photoelectric conversion unit; a first signal line and a second signal line, provided in the first direction, each of which can be connected to the first pixel, the second pixel, the third pixel and the fourth pixel; and a control unit that performs a first control in which a signal of the first pixel is output to the first signal line and a signal of the second pixel is output to the second signal line, and a second control in which a signal of the third pixel and a signal of the fourth pixel are output to the first signal line.

According to the 2nd aspect of the invention, an imaging device, comprises: the image sensor according to the 1st aspect; a detection unit that performs focus detection based on a signal of the first pixel and a signal of the second pixel; and a generation unit that generates an image data based on a signal of the third pixel and a signal of the fourth pixel.

DESCRIPTION OF EMBODIMENTS

First Embodiment

Figure 1:
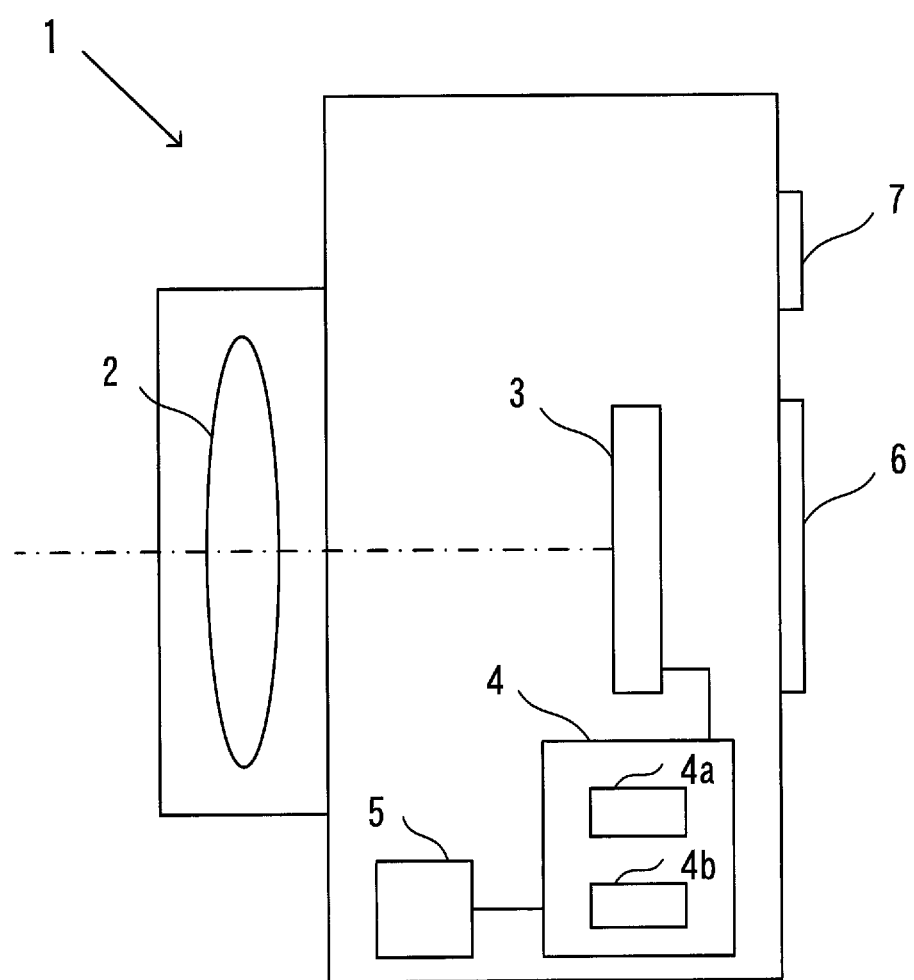
FIG. 1 is a block diagram showing a configuration of an imaging device according to the first embodiment.

FIG. 1 is a block diagram showing a configuration of an imaging device according to the first embodiment. FIG. 1 shows a configuration example of a camera 1 which is as an example of an imaging device according to the first embodiment. The camera 1 includes an image capturing optical system (imaging optical system) 2, an image sensor 3, a control unit 4, a memory 5, a display unit 6, and an operation unit 7. The image capturing optical system 2 is provided with, a plurality of lenses including a focus adjustment lens (focus lens), and an aperture, and forms a subject image on the image sensor 3. It is to be noted that the image capturing optical system 2 may be detachable from the camera 1.

The image sensor 3 is, for example, a CMOS image sensor. The image sensor 3 receives light flux that has passed through the exit pupil of the image capturing optical system 2 to capture a subject image. A plurality of pixels each having a photoelectric conversion unit are arranged in the image sensor 3 in two-dimensional shape (for example, in the row direction and the column direction). The photoelectric conversion unit is configured with, for example, a photodiode (PD). The image sensor 3 photoelectrically converts the received light to generate a signal, and outputs the generated signal to the control unit 4.

The image sensor 3 is provided with imaging pixels and AF pixels (focus detection pixels). The imaging pixel outputs a signal (imaging signal) used for image generation. The AF pixel outputs a signal (focus detection signal) used for focus detection. As will be described later, the AF pixels are arranged by replacing a part of the imaging pixels, and are dispersed and arranged on almost entire of an imaging surface of the image sensor 3. In the following description, in a case the term simply "pixel" is used, it means either one of the imaging pixel and the AF pixel or both.

The memory 5 is, for example, a recording medium such as a memory card. Image data and the like are recorded in the memory 5. Writing of data to the memory 5 and reading of data from the memory 5 are performed by the control unit 4. The display unit 6 displays, an image based on the image data, information related to shooting such as a shutter speed and an aperture value, and a menu screen, and the like. The operation unit 7 includes various setting switches such as a release button and a power switch, and outputs an operation signal corresponding to each operation to the control unit 4.

The control unit 4 is configured with a processor such as a CPU, FPGA, and ASIC, and a memory such as ROM and RAM, and controls each unit of the camera 1 based on a control program. The control unit 4 includes an image data generation unit 4*a* and a focus detection unit 4*b*. The image data generation unit 4*a* performs various image processing on the imaging signal output from the image sensor 3 to generate image data. The image processing includes known image processing such as tone conversion processing, color interpolation processing, and contour enhancement processing.

The focus detection unit 4b performs focus detection processing necessary for automatic focus adjustment (AF) of the capturing optical system 2 by a known phase difference detection method. Specifically, the focus detection unit 4b detects the focusing position of the focus lens for focusing the image by the capturing optical system 2 onto the imaging surface of the image sensor 3. The focus detection unit 4b detects the amount of image shift between the first and second images based on a pair of focus detection signals output from the image sensor 3. The focus detection unit 4b calculates the amount of shift (amount of defocusing) between the current position of the focus lens and the focusing position based on the detected amount of image shift. Focus adjustment is automatically performed by driving the focus lens according to the amount of defocusing.

The control unit 4 controls the image sensor 3 to separately perform of reading signals from a row of pixels in which AF pixels are arranged (hereinafter referred to as an AF pixel row) and to perform of reading signals from a row of pixels in which AF pixels are not arranged (hereinafter referred to as an imaging pixel row). Further, the control unit 4 does not only separately perform of reading signals of the AF pixel row and perform of reading signals of the imaging pixel row, but also perform to sequentially selects all pixel rows and reads the signal of each pixel.

For example, in a case where a through image (live view image) of a subject is displayed on the display unit 6 or a moving image is shot, the control unit 4 separately performs of reading out the signal of each pixel in the AF pixel row and reading out the signal of each pixel in the imaging pixel row. On the other hand, in a case where a high-resolution still image is shot, the control unit 4 performs a processing to sequentially select all pixel rows and read the signal of each pixel.

Figure 2:
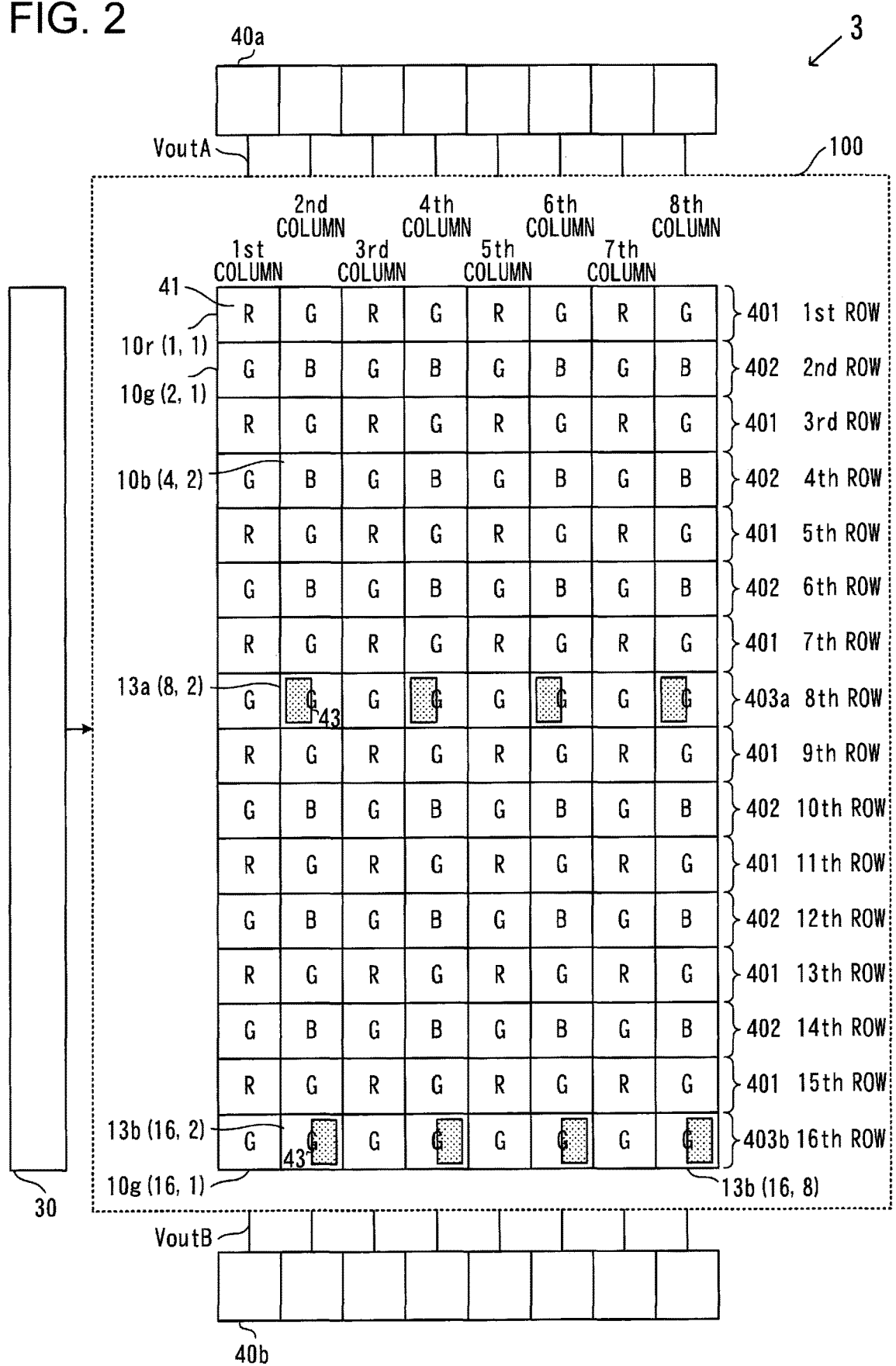
FIG. 2 is a diagram showing a configuration example of an image sensor according to the first embodiment.

FIG. 2 is a diagram showing a configuration example of the image sensor 3 according to the first embodiment. The image sensor 3 includes a pixel unit (pixel area) 100, a vertical control unit 30, and a plurality of readout units 40 (a first readout unit 40a, a second readout unit 40b) arranged above and below the pixel unit 100. In the pixel unit 100 of the image sensor 3, the pixels are arranged in a two-dimensional shape (row direction and column direction). It is to be noted that the number and arrangement of pixels arranged in the pixel unit 100 is not limited to the illustrated example. The pixel unit 100 is provided with, for example, millions to hundreds of millions or more pixels.

In the pixel unit 100, a plurality of imaging pixels 10 and AF pixels 13 (13a, 13b) are arranged. In FIG. 2, the pixel in the upper left corner is the imaging pixel 10 (1,1) in the 1st row and the 1st column, and the pixel in the lower right corner is the AF pixel 13b (16, 8) in the 16th row and the 8th column. That is, 128 pixels from the imaging pixel 10 (1, 1) to the AF pixel 13b (16, 8) are shown in FIG. 2. The 128 pixels of 8 pixels in the row direction and 16 pixels in the column direction shown in FIG. 2 represent a group of pixels arranged in an arbitrary region of the imaging surface of the image sensor 3, and these signs are given to 128 pixels of the 1st to 8th column and 1st to 16th rows of FIG. 2. Therefore, in the image sensor 3, there can be also be pixels in the areas of not only the right side of the pixels in the 8th column and the lower side of the pixels in the 16th row in FIG. 2 but also the left side of the pixels in the 1st column and the upper side of the pixels in the 1st row.

The imaging pixel 10 is provided with any one of three color filters 41 having different spectral characteristics of, for example, R (red), G (green), and B (blue). The R color filter 41 mainly transmits light in the red wavelength region, the G color filter 41 mainly transmits light in the green wavelength region, and the B color filter 41 mainly transmits light in the blue wavelength region. Each pixel have different spectral characteristics depending on the arranged color filter 41. As a result, as the imaging pixel 10, there are a pixel having red (R) spectral characteristics (hereinafter referred to as R pixel), a pixel having green (G) spectral characteristics (hereinafter referred to as G pixel), and a pixel having blue (B) spectral characteristics (hereinafter, referred to as B pixel). The R pixel, the G pixel, and the B pixel are arranged according to the Bayer array.

The first and second AF pixels 13a and 13b are arranged by replacing a part of the imaging pixels 10 of the R, G, and B of the Bayer array as described above. A color filter 41 and a light-shielding film 43 are provided on the first and second AF pixels 13a and 13b. For example, a color filters of G as the color filter 41 is arranged in each of the first and second AF pixels 13a and 13b. In comparison the first AF pixel 13a and the second AF pixel 13b, the positions of the light-shielding units 43 are different. Thereby, the photoelectric conversion unit of the first AF pixel 13a receives the light flux that has passed through the first region among the first and second regions of the exit pupil of the imaging optical system 2. On the other hand, the photoelectric conversion unit of the second AF pixel 13b receives the light flux that has passed through the second region among the first and second regions of the exit pupil of the imaging optical system 2.

As shown in FIG. 2, the image sensor 3 includes a first imaging pixel row 401 in which R pixels 10r and G pixels 10g are alternately arranged in the left-right direction, that is, in the row direction, and a second imaging pixel row 402 in which G pixels 10g and B pixels 10b are arranged alternately in the row direction. Further, the image sensor 3 includes a first AF pixel row 403a in which the G pixel 10g and the first AF pixel 13a are alternately arranged in the row direction, and a second AF pixel row 403b in which the G pixel 10g and the second AF pixel 13b are alternately arranged in the row direction.

The vertical control unit 30 is controlled by the control unit 4 of the camera 1 and supplies a control signal to each pixel to control the operation of each pixel. Each of a first readout unit 40a and a second readout unit 40b is configured to include an analog/digital conversion unit (AD conversion unit). The signal of the pixel of the pixel unit 100 selected by the vertical control unit 30 is output to a first vertical signal line VoutA or a second vertical signal line VoutB connected to the pixel. The signal of the pixel output to the first vertical signal line VoutA is converted to a digital signal by the first readout unit 40a and then output to the control unit 4. The signal of the pixel output to the second vertical signal line VoutB is converted to a digital signal by the second readout unit 40b and then output to the control unit 4.

Figure 3:
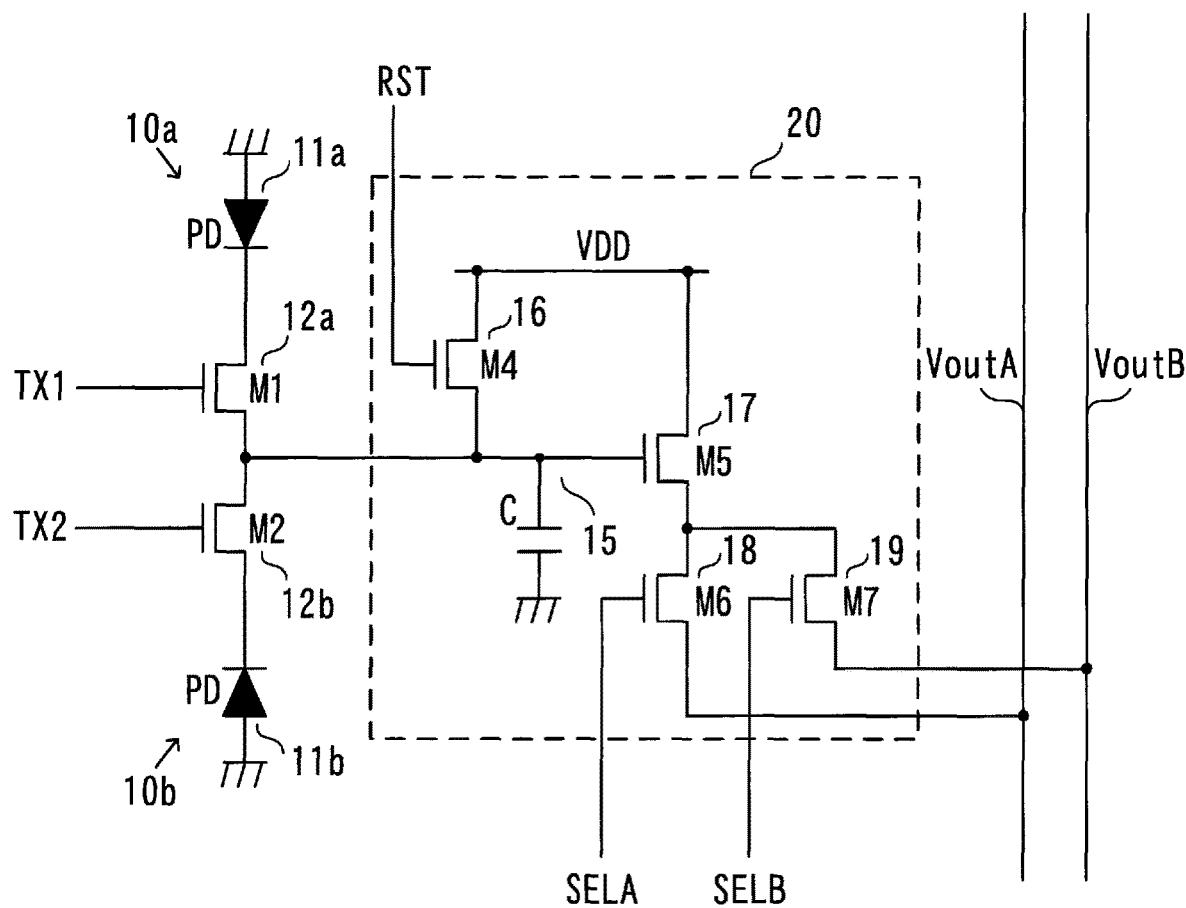
FIG. 3 is a diagram showing a configuration example of a pixel of the image sensor according to the first embodiment.

FIG. 3 is a diagram showing a configuration of a pixel of the image sensor 3 according to the first embodiment. Each pixel (pixels 10a and 10b in FIG. 3) is configured to include a photoelectric conversion unit 11 and a transfer unit 12, respectively. The pixel 10a has a photoelectric conversion unit 11a and a transfer unit 12a, and the pixel 10b has a photoelectric conversion unit 11b and a transfer unit 12b. The photoelectric conversion unit 11 is a photodiode PD, which converts incident light to electric charges and stores the photoelectrically converted electric charges.

As shown by the broken line 20, the image sensor 3 according to the present embodiment has a configuration in which two adjacent pixels share a floating diffusion (FD) 15, a reset unit 16, an amplification unit 17, a first selection unit 18, and a second selection unit 19.

The transfer unit 12a of the pixel 10a is composed of a transistor M1 controlled by a signal TX1, and transfers the electric charge photoelectrically converted by the photoelectric conversion unit 11a to the FD 15. That is, the transfer unit 12a constitutes an electric charge transfer path between the photoelectric conversion unit 11a and the FD 15. The transfer unit 12b of the pixel 10b is composed of a transistor M2 controlled by a signal TX2, and transfers the electric charge photoelectrically converted by the photoelectric conversion unit 11b to the FD 15. That is, the transfer unit 12b constitutes an electric charge transfer path between the photoelectric conversion unit 11b and the FD 15. The transistors M1 and M2 are transfer transistors, respectively. The capacitor C of the FD 15 accumulates (holds) the charge transferred to the FD 15 and converts to a voltage that accumulated electric charge value dividing by the capacitance value of the capacitor C.

The amplification unit 17 amplifies and outputs a signal corresponding to the electric charge accumulated in the capacitor C of the FD 15. The amplification unit 17 is configured with a transistor M5 in which drain (terminal) and gate (terminal) are connected to a power supply VDD and the FD 15, respectively. The source (terminal) of the transistor M5 is connected to the first vertical signal line VoutA via the first selection unit 18, and is connected to the second vertical signal line VoutB via the second selection unit 19. The amplification unit 17 functions as a part of a source follower circuit using current sources (current sources 25a and 25b in FIG. 4) described later as the load current source. The transistor M5 is an amplification transistor.

The reset unit 16 is composed of a transistor M4 controlled by a signal RST, resets an electric charge of the FD 15, and resets a voltage of the FD 15. The transistor M4 is a reset transistor.

The first selection unit 18 is composed of a transistor M6 controlled by a signal SELA, and electrically connects or disconnects the amplification unit 17 and the first vertical signal line VoutA. The transistor M6 of the first selection unit 18 outputs a signal from the amplification unit 17 to the first vertical signal line VoutA in a case the ON state. The second selection unit 19 is composed of a transistor M7 controlled by a signal SELB, and electrically connects or disconnects the amplification unit 17 and the second vertical signal line VoutB. The transistor M7 of the second selection unit 19 outputs a signal from the amplification unit 17 to the second vertical signal line VoutB in a case the ON state. The transistor M6 is a first selection transistor, and the transistor M7 is a second selection transistor.

As described above, the electric charge photoelectrically converted by the photoelectric conversion unit 11 is transferred to the FD 15 by the transfer unit 12. Then, a signal (pixel signal) corresponding to the electric charge transferred to the FD 15 is output to the first vertical signal line VoutA or the second vertical signal line VoutB. The pixel signal is an analog signal generated based on the electric charge photoelectrically converted by the photoelectric conversion unit 11. The pixel signal output from the imaging pixel 10 is output to the control unit 4 as an imaging signal after being signal processed by the readout unit 40.

It is to be noted that, in the present embodiment, the circuit configurations of both the first AF pixel 13a and the second AF pixel 13b are the same as the circuit configurations of the imaging pixel 10. The pixel signals output from the first AF pixel 13a and the second AF pixel 13b are output to the control unit 4 as a pair of focus detection signals after being signal processed by the readout unit 40.

Figure 4:
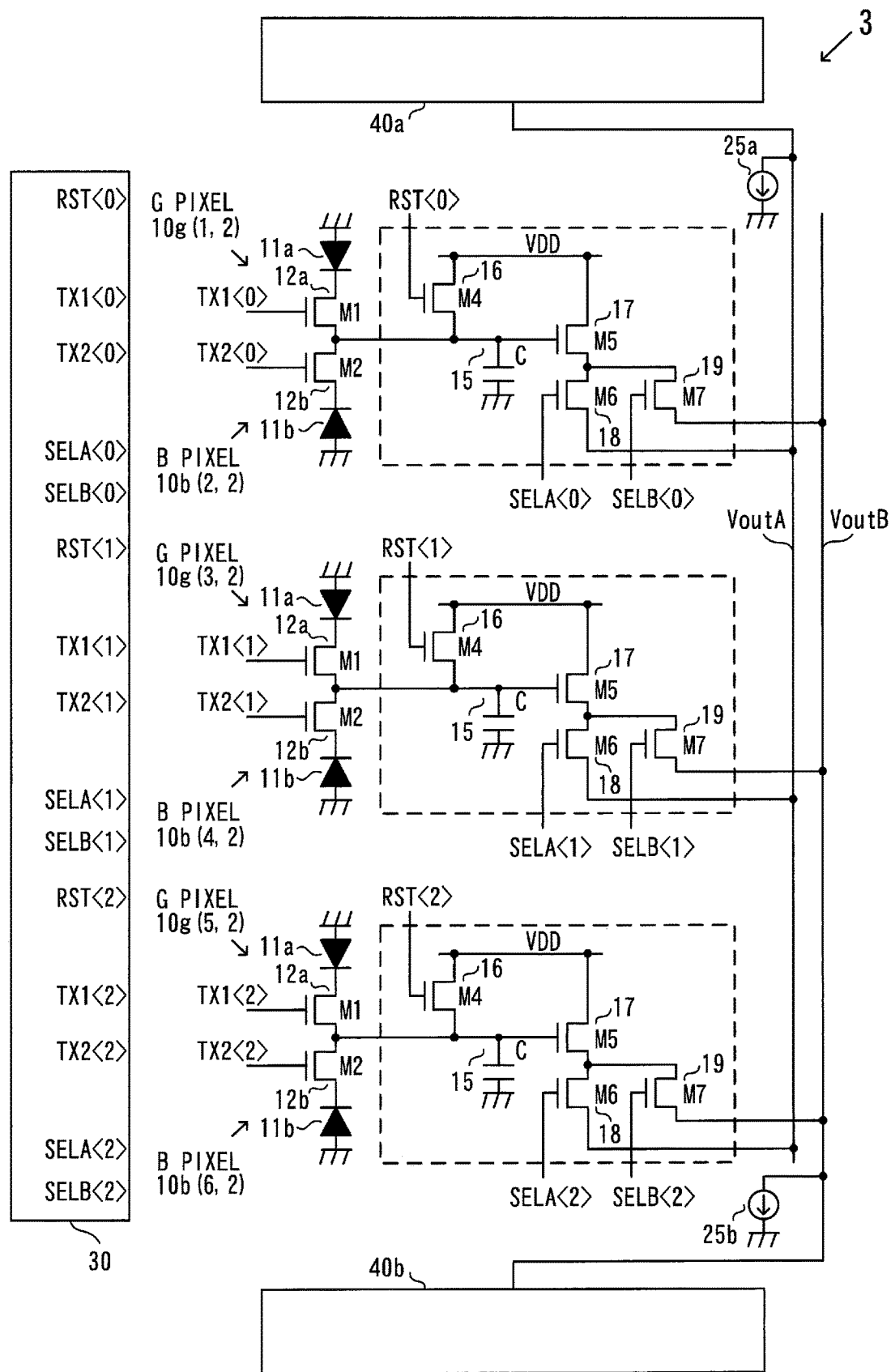
FIG. 4 is a diagram showing a configuration example of a part of the image sensor according to the first embodiment.

FIG. 4 is a diagram showing a configuration of a part of the image sensor 3 according to the first embodiment. In FIG. 4, among a plurality of pixels arranged in the column direction (vertical direction) which is the first direction and the row direction (horizontal direction) which is the second direction intersecting the first direction, a part of one pixel column among a plurality of pixels columns arranged in the column direction is shown. The configurations of the other pixel columns are also the same as the configuration of the pixel column shown in FIG. 4. The image sensor 3 is provided with the vertical control unit 30 and the plurality of readout units 40 (the first readout unit 40a, the second readout unit 40b). The vertical control unit 30 is provided for a plurality of pixel columns in common.

The image sensor 3 is provided with the first vertical signal line VoutA and the second vertical signal line VoutB for a plurality of pixel column arranged in the column direction. Further, to the first vertical signal line VoutA, the first current source 25a and the first readout unit 40a are provided, and to the second vertical signal line VoutB, the second current source 25b and the second readout unit 40b are provided. It is to be noted that, in the example shown in FIG. 4, for simplification of the description, only 1 pixel in the row direction×6 pixels in the column direction are shown. That is, in FIG. 4, among the plurality of pixels shown in FIG. 2, the G pixel 10g (1, 2) in the 1st row and 2nd column, the B pixel 10b (2, 2) in the 2nd row and 2nd column, the G pixel 10g (3, 2) in the 3rd row and 2nd column, the B pixel 10b (4, 2) in the 4th row and 2nd column, the G pixel 10g (5, 2) in the 5th row and 2nd column, and the B pixel 10b (6, 2) in the 6th row and the 2nd column are illustrated.

The first current source 25a is connected to each pixel via the first vertical signal line VoutA, and the second current source 25b is connected to each pixel via the second vertical signal line VoutB. The first current source 25a and the second current source 25b generate a current for reading a signal from each pixel. The first current source 25a supplies the generated current to the first vertical signal line VoutA, and the first selection unit 18 and the amplification unit 17 of each pixel. Similarly, the second current source 25b supplies the generated current to the second vertical signal line VoutB, and the second selection unit 19 and the amplification unit 17 of each pixel.

The first readout unit 40a is configured to include an AD conversion unit, and converts an analog signal input from each pixel via the first vertical signal line VoutA to a digital signal. The second readout unit 40b is configured to include an AD conversion unit, and converts an analog signal input from each pixel via the second vertical signal line VoutB to a digital signal.

The vertical control unit 30 supplies the signal TX1, the signal TX2, the signal RST, the signal SELA, and the signal SELB to each pixel, and controls the operation of each pixel. Specifically, the vertical control unit 30, by supplying a signal to the gate of each transistor, turns the transistor to ON state (connected state, conductive state, short-circuited state) or to OFF state (disconnected state, non-conducting state, open state, shut-off state).

In a case the control unit 4 requests the vertical control unit 30 to read out the signal of each pixel in the imaging pixel row (the first imaging pixel row 401, the second imaging pixel row 402 in FIG. 2), the vertical control unit 30 performs a processing (a first readout control) in which selecting the imaging pixel row in units of two rows and reading out pixel signals.

In a case the control unit 4 requests the vertical control unit 30 to read out the signal of each pixel in the AF pixel row (the first AF pixel row 403*a* and the second AF pixel row 403*b* in FIG. 2), the vertical control unit 30 performs a processing (a second readout control) in which selecting the AF pixel row in units of two rows and reading out pixel signals.

It is to be noted that, in a case reading out a signal from the AF pixel row, the vertical control unit 30 can also perform a processing (a third readout control) in which selecting the AF pixel row in row by row and reading out pixel signals.

As described above, the vertical control unit 30 according to the present embodiment performs the first readout control, the second readout control, and the third readout control. The control unit 4 of the camera 1 can control the vertical control unit 30 to switch the reading out method of the pixel signal. Hereinafter, the first readout control, the second readout control, and the third readout control will be respectively described.

First, the first readout control will be described with reference to FIG. 4. In the first readout control, the vertical control unit 30 selects the imaging pixel row of the image sensor 3 in units of two rows and sequentially reads out signals from these pixels. In the following, the first read control will be described, taking as an example of a case where a pixel signals are read out from B pixel 10*b* (2, 2), G pixel 10*g* (3, 2), B pixel 10*b* (4, 2), and G pixel 10*g* (5, 2).

The vertical control unit 30 turns to ON state the second selection unit 19 of the B pixel 10*b* (2, 2) of the 2nd row. That is, the vertical control unit 30 turns the second selection unit 19, that is shared by the G pixel 10*g* (1, 2) of the 1st row and the B pixel 10*b* (2, 2) in the 2nd row, to ON state. The vertical control unit 30 turns to OFF state the first selection unit 18 of the B pixel 10*b* (2, 2). That is, the vertical control unit 30 turns the first selection unit 18, that is shared by the G pixel 10*g* (1, 2) and the B pixel 10*b* (2, 2), to OFF state. The vertical control unit 30 turns to ON state the first selection unit 18 of the G pixel 10*g* (3, 2) of the 3rd row. That is, the vertical control unit 30 turns the first selection unit 18, that is shared by the G pixel 10*g* (3, 2) of the 3rd row and the B pixels 10*b* (4, 2) in the 4th row, to ON state. The vertical control unit 30 turns to OFF state the second selection unit 19 of the G pixel 10*b* (3, 2). That is, the vertical control unit 30 turns the second selection unit 19, that is shared by the G pixel 10*g* (3, 2) and the B pixel 10*b* (4, 2), to OFF state. The vertical control unit 30 turns to OFF state the first selection unit 18 and the second selection unit 19 of each of the pixels of other rows other than the 1st row, the 2nd row, the 3rd row, and the 4th row.

The pixel signal based on the electric charge generated at the photoelectric conversion unit 11*b* of the B pixel 10*b* (2, 2) in the 2nd row is output to the second vertical signal line VoutB via the second selection unit 19 of the B pixel 10*b* (2, 2). Further, the pixel signal based on the electric charge generated at the photoelectric conversion unit 11*a* of the G pixel 10*g* (3, 2) in the 3rd row is output to the first vertical signal line VoutA via the first selection unit 18 of the G pixel 10*g* (3, 2).

After reading out the pixel signals from the pixels of the 2nd and 3rd rows, the vertical control unit 30 turns to ON state the second selection unit 19 and OFF state the first selection unit 18 of the B pixel 10*b* (4, 2) in the 4th row. Further, the vertical control unit 30 turns to ON state the first selection unit 18 and OFF state the second selection unit 19 of the G pixel 10*g* (5, 2) in the 5th row. The vertical control unit 30 turns to OFF state the first selection unit 18 and the second selection unit 19 of each pixel in the rows other than the 3rd row, the 4th row, the 5th row, and the 6th row.

The pixel signal of the B pixel 10*b* (4, 2) in the 4th row is output to the second vertical signal line VoutB via the second selection unit 19 of the B pixel 10*b* (4, 2). Further, the pixel signal of the G pixel 10*g* (5, 2) in the 5th row is output to the first vertical signal line VoutA via the first selection unit 18 of the G pixel 10*g* (5, 2). Similarly, with respect to subsequent image pixel rows after 6th image pixel row in the image sensor 3, the image pixel rows are selected in units of two rows and pixel signals are output.

As described above, in the case of the first readout control, in the image sensor 3, the imaging pixel rows are selected in units of two rows and the pixel signals are output to the first vertical signal line VoutA from one row among the selected two imaging pixel rows. At the same time, pixel signals of the imaging pixels in the other row are output to the second vertical signal line VoutB. The pixel signals sequentially output to the first vertical signal line VoutA are input to the first readout unit 40*a*, and the pixel signals sequentially output to the second vertical signal line VoutB are input to the second readout unit 40*b*. Therefore, the pixel signal output to the first vertical signal line VoutA and the pixel signal output to the second vertical signal line VoutB can be performed signal processing at the same time (in parallel). The pixel signal output from each imaging pixel is converted to a digital signal by the readout unit 40, and then output to the control unit 4 as an imaging signal.

In the present embodiment, the pixel signals from a plurality of the G pixels 10*g* (the G pixel 10*g* (1, 2), the G pixel 10*g* (3, 2), the G pixel 10*g* (5, 2) in FIG. 4) in the same column are output to the common (the same) first vertical signal line VoutA and are input to the common (the same) first readout unit 40*a*. The AD conversion unit of the first readout unit 40*a* converts the input pixel signal of each G pixel 10*g* to a digital signal. The pixel signal of each G pixel 10*g* is processed by a common AD conversion unit. The pixel signals from a plurality of the B pixels 10*b* (the B pixel 10*b* (2, 2), the B pixel 10*b* (4, 2), the B pixel 10*b* (6, 2) in FIG. 4) in the same column are output to the common second vertical signal line VoutB and are then input to the common second readout unit 40*b* to be processed. As described above, in the present embodiment, the pixel signals from the imaging pixels 10, to which the color filters 41 of the same color are arranged, in the same column are input to the common reading unit 40 and processed.

In a case of separate readout units provided at positions separated from each other, there is a possibility that the characteristics of each readout unit may vary due to manufacturing variations and the like. For example, the conversion gain (AD conversion gain) when converting a pixel signal of an analog signal to a digital signal is different for each readout unit. Therefore, in a case the pixel signals of the same color pixels in the same column are input to different readout units respectively, the pixel signals converted to digital signals have difference due to the AD conversion gain deviation.

On the other hand, in the image sensor 3 according to the present embodiment, the pixel signals of the same color pixels in the same column are input to the common reading unit 40, therefore, it is possible to suppress the occurrence of the difference in the pixel signals due to the variation in the characteristics of each readout unit 40. For example, in the pixel signal of each imaging pixel 10, the difference due to the AD conversion gain deviation can be suppressed. As a result, it is possible to prevent deterioration of the image quality of the image generated by using the imaging signals.

Figure 5:
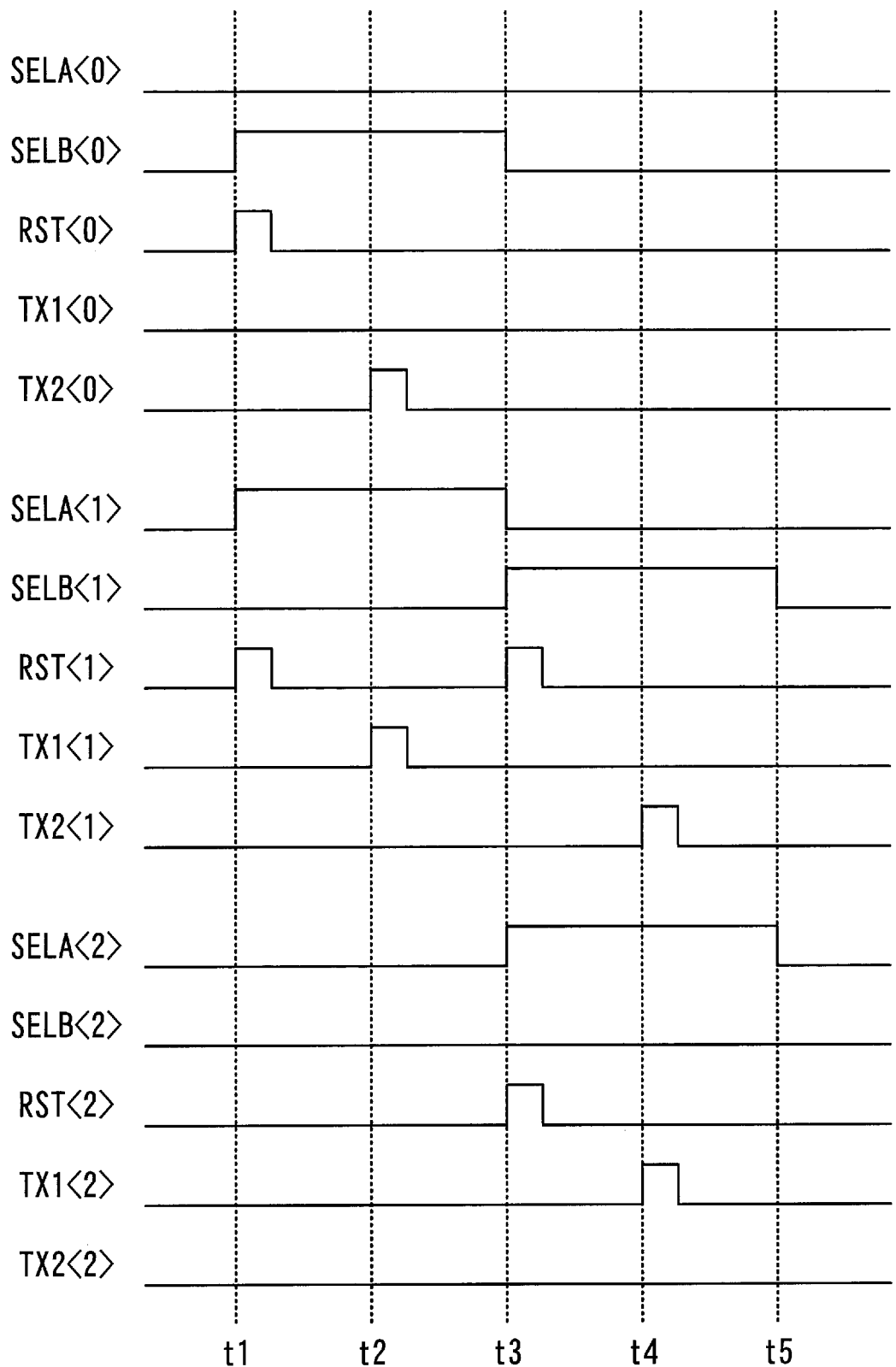
FIG. 5 is a timing chart showing an operation example of the image sensor according to the first embodiment.

FIG. 5 is a timing chart showing an example of the first readout control of the image sensor 3 according to the first embodiment. In the timing chart shown in FIG. 5, the horizontal axis indicates the time, indicates the control signal input to each part of the image sensor 3 of FIG. 4 in the first readout control. Further, in FIG. 5, the transistor to which the high level (for example, power supply potential) control signal is input turns to ON state, and the transistor to which the low level (for example, ground potential) control signal is input turns to OFF state.

At the time t1 shown in FIG. 5, the signal RST <0> and the signal RST <1> become high level. Upon the signal RST <0> becoming high level, the transistor M4 of the reset unit 16 shared by the G pixel 10g (1, 2) in the 1st row and the B pixel 10b (2, 2) in the 2nd row, turns to ON state. As a result, the electric charge of the capacitor C of the FD 15 shared by the G pixel 10g (1, 2) and the B pixel 10b (2, 2) is reset, and the potential of the FD 15 becomes the reset potential.

Further, upon the signal RST <1> becoming high level, the transistor M4 of the reset unit 16 shared by the G pixel 10g (3, 2) in the 3rd row and the B pixel 10b (4, 2) in the 4th row, turns to ON state. As a result, the electric charge of the capacitor C of the FD 15 shared by the G pixel 10g (3, 2) and the B pixel 10b (4, 2) is reset, and the potential of the FD 15 becomes the reset potential.

Further, at the time t1, the signal SELB <0> and the signal SELA <1> become high level. Upon becoming high level the signal SELB <0>, the signal based on the reset potential of the B pixel 10b (2, 2) is output to the second vertical signal line VoutB by the amplification unit 17 and the second selection unit 19 of the B pixel 10b (2, 2). That is, the signal (reset signal) after resetting the electric charge of the FD 15 of the B pixel 10b (2, 2) is output to the second vertical signal line VoutB.

Further, upon the signal SELA <1> becoming high level, the reset signal of the G pixel 10 g (3, 2) is output to the vertical signal line VoutA by the amplification unit 17 and the first selection unit 18 of the G pixel 10 g (3, 2).

In this way, to the first vertical signal line VoutA and the second vertical signal line VoutB, the reset signal from the G pixel 10g (3,2) in the 3rd row and the reset signal from the B pixel 10b (2,2) in the 2nd row are respectively output at the same time. The reset signals output to the first vertical signal line VoutA and the second vertical signal line VoutB are input to the first readout unit 40a and the second readout unit 40b, respectively, and converted to digital signals.

At the time t2, the signal TX2 <0> and the signal TX1 <1> become high level. Upon becoming high level the signal TX2 <0>, in the B pixel 10b (2, 2), the transistor M2 of the transfer unit 12b turns to ON state and the electric charge photoelectrically converted by the photoelectric conversion unit 11b is transferred to the FD 15. Further, upon the signal TX 1 <1> becoming high level, in the G pixel 10g (3, 2), the transistor M1 of the transfer unit 12a turns to ON state and the electric charge photoelectrically converted by the photoelectric conversion unit 11a is transferred to the FD 15.

At time t2, since the signal SELB <0> is at high level, the pixel signal based on the electric charge generated by the photoelectric conversion unit 11b of the B pixel 10b (2, 2) is output to the second vertical signal line VoutB by the amplification unit 17 and the second selection unit 19. Further, since the signal SELA <1> is at high level, the pixel signal of the G pixel 10 g (3, 2) is output to the first vertical signal line VoutA by the amplification unit 17 and the first selection unit 18.

In this way, to the first vertical signal line VoutA and the second vertical signal line VoutB, the pixel signal of the G pixel 10g (3, 2) in the 3rd row and the pixel signal of the B pixel 10b (2, 2) in the 2nd row are respectively output at the same time. The pixel signals respectively output to the first vertical signal line VoutA and the second vertical signal line VoutB are respectively input to the first readout unit 40a and the second readout unit 40b, and converted to digital signals. The reset signal and the pixel signal, from which converted to digital signals are input to a signal processing unit (not shown). The signal processing unit performs signal processing such as correlated double sampling that performs difference processing between the reset signal and the pixel signal, and then outputs the processed pixel signal to the control unit 4.

At the time t3, the signal RST <1> and the signal RST <2> become high level. Upon becoming high level the signal RST <1>, the transistor M4 of the reset unit 16 shared by the G pixel 10g (3, 2) in the 3rd row and the B pixel 10b (4, 2) in the 4th row, turns to ON state. As a result, the electric charge of the capacitor C of the FD 15 shared by the G pixel 10g (3, 2) and the B pixel 10b (4, 2) is reset.

Further, upon becoming high level the signal RST <2>, the transistor M4 of the reset unit 16 shared by the G pixel 10g (5, 2) in the 5th row and the B pixel 10b (6, 2) in the 6th row, turns to ON state. As a result, the electric charge of the capacitor C of the FD 15 shared by the G pixel 10g (5, 2) and the B pixel 10b (6, 2) is reset.

At the time t3, the signal SELB <1> and the signal SELA <2> become high level. Upon becoming high level the signal SELB <1>, the reset signal of the B pixel 10b (4, 2) is output to the second vertical signal line VoutB by the amplification unit 17 and the second selection unit 19. Further, upon becoming high level the signal SELA <2>, the reset signal of the G pixel 10g (5, 2) is output to the first vertical signal line VoutA by the amplification unit 17 and the first selection unit 18.

In this way, to the first vertical signal line VoutA and the second vertical signal line VoutB, the reset signals of the G pixel 10g (5, 2) in the 5th row and the B pixel 10b (4, 2) in the 4th row are respectively output at the same time. The reset signals respectively output to the first vertical signal line VoutA and the second vertical signal line VoutB are respectively input to the first readout unit 40a and the second readout unit 40b, and converted to digital signals.

At the time t4, the signal TX2 <1> and the signal TX1 <2> become high level. Upon becoming high level the signal TX2 <1>, in the B pixel 10b (4, 2), the electric charge photoelectrically converted by the photoelectric conversion unit 11b is transferred to the FD 15. Further, upon becoming high level the signal TX1 <2>, in the G pixel 10g (5, 2), the electric charge photoelectrically converted by the photoelectric conversion unit 11a is transferred to the FD 15. At the time t4, since the signal SELB <1> is at high level, the pixel signal of the B pixel 10b (4, 2) is output to the second vertical signal line VoutB by the amplification unit 17 and the second selection unit 19. Further, since the signal SELA <2> is at high level, the pixel signal of the G pixel 10 g (5, 2) is output to the first vertical signal line VoutA by the amplification unit 17 and the first selection unit 18.

In this way, to the first vertical signal line VoutA and the second vertical signal line VoutB, the pixel signals of the G pixel 10g (5,2) in the 5th row and the B pixel 10b (4,2) in the 4th row are respectively output at the same time. The pixel signals respectively output to the first vertical signal line VoutA and the second vertical signal line VoutB are respectively input to the first readout unit 40a and the second readout unit 40b, and converted to digital signals. The reset signal and the pixel signal, from which converted to digital signals are input to a signal processing unit (not shown). The signal processing unit performs signal processing such as correlated double sampling and then outputs the processed pixel signals to the control unit 4.

In the period after the time t5, as in the same manner as in the period from the time t1 to the time t5, the imaging pixel rows are selected in units of two rows and readout of the reset signal and readout of the pixel signal are performed. As described above, in the first readout control shown in FIG. 5, it is possible to select the imaged pixel rows in units of two rows and read out the pixel signals from a plurality of rows simultaneously.

Figure 6:
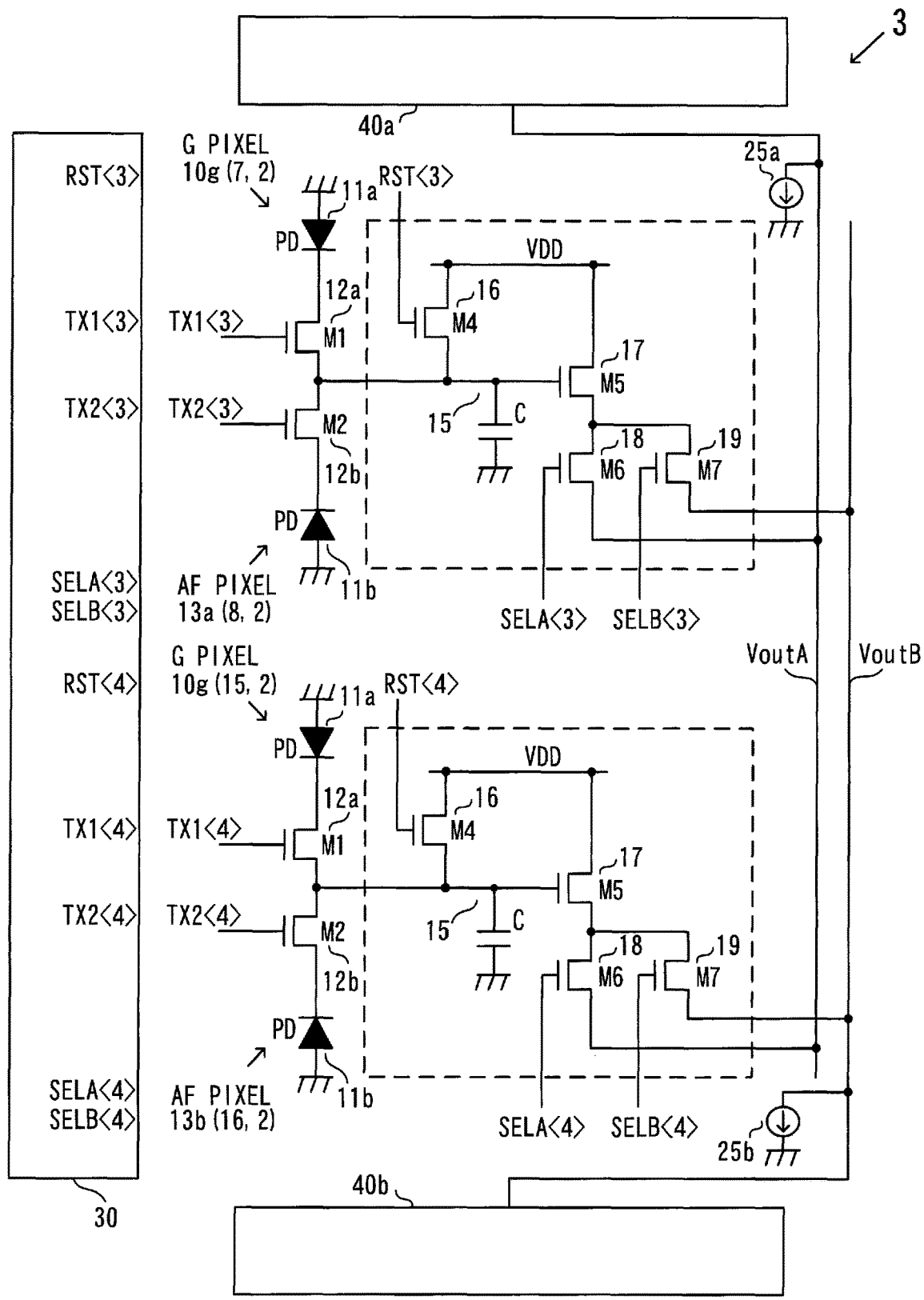
FIG. 6 is a diagram showing a configuration example of a part of the image sensor according to the first embodiment.

Next, the second readout control will be described with reference to FIG. 6 and FIG. 7. In the example shown in FIG. 6, for simplification of the description, among the plurality of pixels shown in FIG. 2, the G pixel 10g (7, 2) in the 7th row and 2nd column, the first AF pixel 13a (8, 2) in the 8th row and 2nd column, the G pixel 10g (15, 2) in the 15th row and 2nd column, the second AF pixel 13b (16, 2) in the 16th row and 2nd column are illustrated. In the second readout control, the vertical control unit 30 sequentially selects the AF pixel rows of the image sensor 3 in units of two rows, and sequentially reads out signals from the pixels.

The vertical control unit 30 turns to ON state the first selection unit 18 and turns to OFF state the second selection unit 19 in the first AF pixel 13a (8, 2) in the 8th row, which is the AF pixel line. Further, the vertical control unit 30 turns to ON state the second selection unit 19 and turns to OFF the first selection unit 18 in the second AF pixel 13b (16, 2) in the 16th row, which is the AF pixel line. The vertical control unit 30 turns to OFF state the first selection unit 18 and the second selection unit 19 of each pixel in the rows other than the 7th row, the 8th row, the 15th row, and the 16th row. As a result, the pixel signal of the first AF pixel 13a (8, 2) in the 8th row is output to the first vertical signal line VoutA via the first selection unit 18 of the first AF pixel 13a (8, 2). Further, the pixel signal of the second AF pixel 13b (16, 2) in the 16th row is output to the second vertical signal line VoutB via the second selection unit 19 of the second AF pixel 13b (16, 2). Similarly, in the image sensor 3, with respect to the AF pixel rows from the 17th row onward, the AF pixel rows are sequentially selected in units of two rows and a pixel signals are output.

As described above, in the case of the second readout control, in the image sensor 3, the AF pixel rows are selected in units of two rows, and pixel signals are output from one of the AF pixel rows to the first vertical signal line VoutA. At the same time, pixel signals is output from the other of the AF pixel rows to the second vertical signal line VoutB. Therefore, a signal can be read out at high speed from each AF pixel 13 arranged in the image sensor 3. That is, in the image sensor 3, a readout time of the signal from the AF pixel 13 can be shortened. As a result, the control unit 4 can reduce the time required for focus detection and focus adjustment.

The pixel signals output to the first vertical signal line VoutA and the second vertical signal line VoutB are input to the first readout unit 40a and the second readout unit 40b, respectively, and converted to digital signals. Since the pixel signals of the AF pixels 13 are processed in parallel by the first readout unit 40a and the second readout unit 40b, an AD conversion processing of the pixel signals of the AF pixels can be performed at high speed. The pixel signal of the first AF pixel 13a and the pixel signal of the second AF pixel 13b are each converted to a digital signal by the readout unit 40, and then output to the control unit 4 as a pair of focus detection signals.

Figure 7:
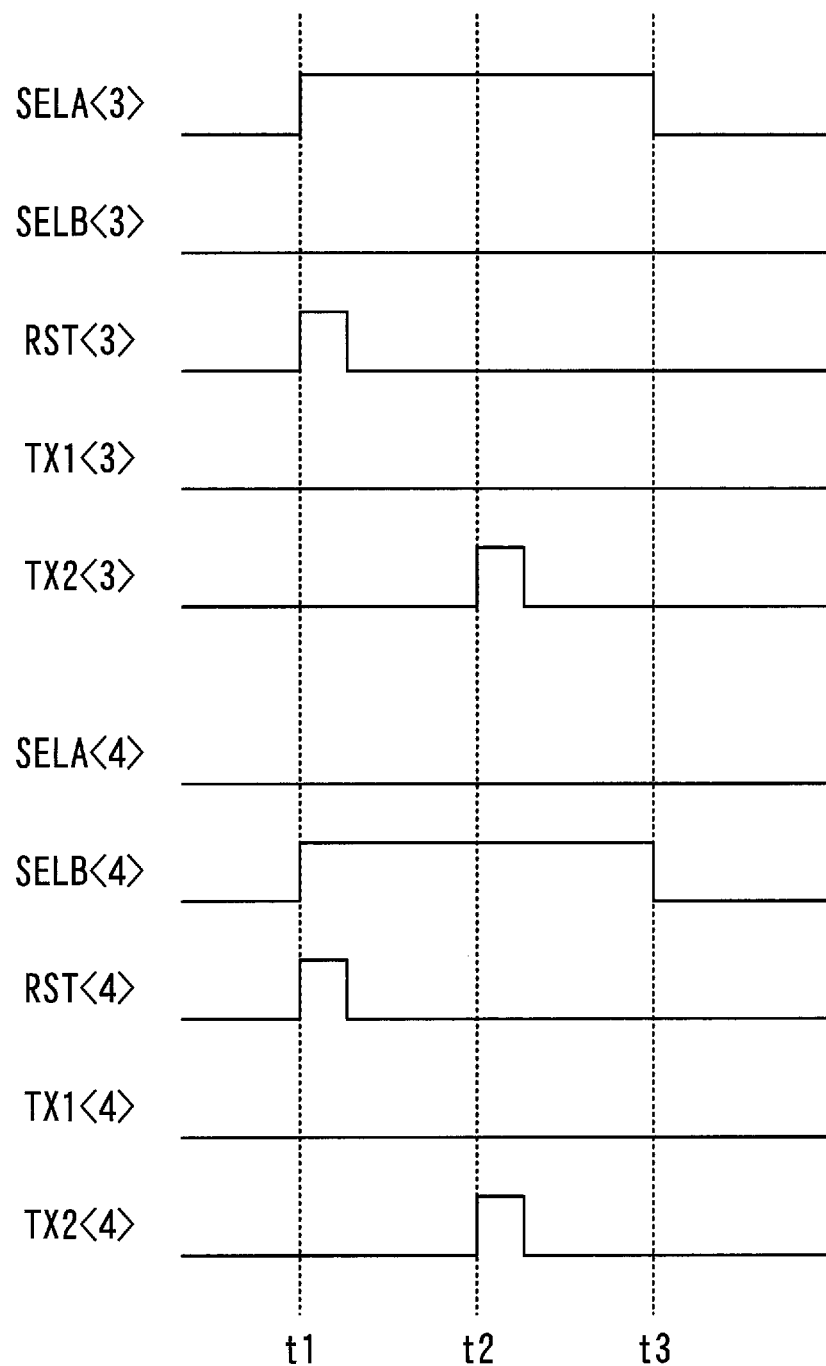
FIG. 7 is a timing chart showing another operation example of the image sensor according to the first embodiment.

FIG. 7 is a timing chart showing an example of the second readout control of the image sensor 3 according to the first embodiment. In the timing chart shown in FIG. 7, the horizontal axis indicates the time, indicates the control signal input to each part of the image sensor 3 of FIG. 6 in the second readout control.

At the time t1 shown in FIG. 7, the signal RST <3> and the signal RST <4> become high level. Upon the signal RST <3> becoming high level, the electric charge of the capacitor C of the FD 15 shared by the G pixel 10g (7, 2) in the 7th row and the first AF pixel 13a (8, 2) in the 8th row is reset. Further, upon the signal RST <4> becoming high level, the electric charge of the capacitor C of the FD 15 shared by the G pixel 10g (15, 2) in the 15th row and the second AF pixel 13b (16, 2) in the 16th row is reset.

Further, at time t1, the signal SELA <3> and the signal SELB <4> become high level. Upon becoming high level the signal SELA <3>, the reset signal of the first AF pixel 13a (8, 2) is output to the first vertical signal line VoutA by the amplification unit 17 and the first selection unit 18. Further, upon becoming high level the signal SELB <4>, the reset signal of the second AF pixel 13b (16, 2) is output to the second vertical signal line VoutB by the amplification unit 17 and the second selection unit 19.

In this way, to the first vertical signal line VoutA and the second vertical signal line VoutB, the reset signal from the first AF pixel 13a (8, 2) in the 8th row and the reset signal from the second AF pixel 13b (16, 2) in the 16th row are respectively output at the same time. The reset signals output to the first vertical signal line VoutA and the second vertical signal line VoutB are input to the first readout unit 40a and the second readout unit 40b, respectively, and converted to digital signals.

At the time t2, the signal TX2 <3> and the signal TX2 <4> become high level. Upon becoming high level the signal TX2 <3>, in the first AF pixel 13a (8, 2) in the 8th row, the electric charge photoelectrically converted by the photoelectric conversion unit 11b is transferred to the FD 15. Further, upon the signal TX 2<4> becoming high level, in the second AF pixel 13b (16, 2) in the 16th row, the electric charge photoelectrically converted by the photoelectric conversion unit 11b is transferred to the FD 15.

At the time t2, since the signal SELA<3> is at high level, the pixel signal of the first AF pixel 13a (8, 2) is output to the first vertical signal line VoutA by the amplification unit 17 and the first selection unit 18. Further, since the signal SELB<4> is at high level, the pixel signal of the second AF pixel 13b (16, 2) is output to the second vertical signal line VoutB by the amplification unit 17 and the second selection unit 19.

In this way, to the first vertical signal line VoutA and the second vertical signal line VoutB, the pixel signal of the first AF pixel 13a (8, 2) in the 8th row and the pixel signal of the second AF pixel 13b (16, 2) in the 16th row are respectively output at the same time. The pixel signals respectively output to the first vertical signal line VoutA and the second vertical signal line VoutB are respectively input to the first readout unit 40a and the second readout unit 40b, and converted to digital signals. The reset signal and the pixel signal, from which converted to digital signals are input to a signal processing unit (not shown). The signal processing unit performs signal processing such as correlated double sampling that performs difference processing between the reset signal and the pixel signal, and then outputs the processed pixel signal to the control unit 4.

Next, the third readout control will be described with reference to FIG. 6 and FIG. 8. In the third readout control, the vertical control unit 30 sequentially selects the AF pixel row of the image sensor 3 in row by row, and sequentially reads out signals from the pixels.

The vertical control unit 30 turns to ON state the first selection unit 18 of the first AF pixel 13*a* (8, 2) in the 8th row, which is the AF pixel row, and turns to OFF state the second selection unit 19 of the first AF pixel 13*a* (8, 2). Further, the vertical control unit turns to OFF state the first selection unit 18 and the second selection unit 19 respectively of each pixel in the rows other than the 7th row and the 8th row. As a result, the pixel signal of the first AF pixel 13 *a* (8, 2) on the 8th row is output to the first vertical signal line VoutA via the first selection unit 18.

After reading out the pixel signals from the pixels in the 8th row, the vertical control unit 30 turns to ON state the first selection unit 18 of the second AF pixel 13*b* (16, 2) in the 16th row, which is the AF pixel row, and turns to OFF state the second selection unit 19 of the second AF pixel 13*b* (16, 2) in the 16th row. Further, the vertical control unit turns to OFF state the first selection unit 18 and the second selection unit 19 respectively of each pixel of the rows other than the 15th row and the 16th row. As a result, the pixel signal of the second AF pixel 13*b* (16, 2) on the 16th row is output to the first vertical signal line VoutA via the first selection unit 18.

It is to be noted that, the example of outputting the pixel signal of the AF pixel 13 to the first vertical signal line VoutA has been described, however, in a case the first selection unit 18 is to be in OFF state and the second selection unit 19 is to be in ON state, the pixel signal can be output from the AF pixel 13 to the second vertical signal line VoutB.

As described above, in the case of the third readout control, in the image sensor 3, the AF pixel row is selected row by row and the pixel signal is output to the first vertical signal line VoutA (or the second vertical signal VoutB) from each pixel in the AF pixel row. The pixel signal of each AF pixel in the same column is input to the AD conversion unit of the common readout unit 40. Therefore, it is possible to suppress the difference due to the AD conversion gain deviation in the pixel signal output from each AF pixel. As a result, it is possible to prevent a decrease in the accuracy of focus detection using the focus detection signal.

Figure 8:
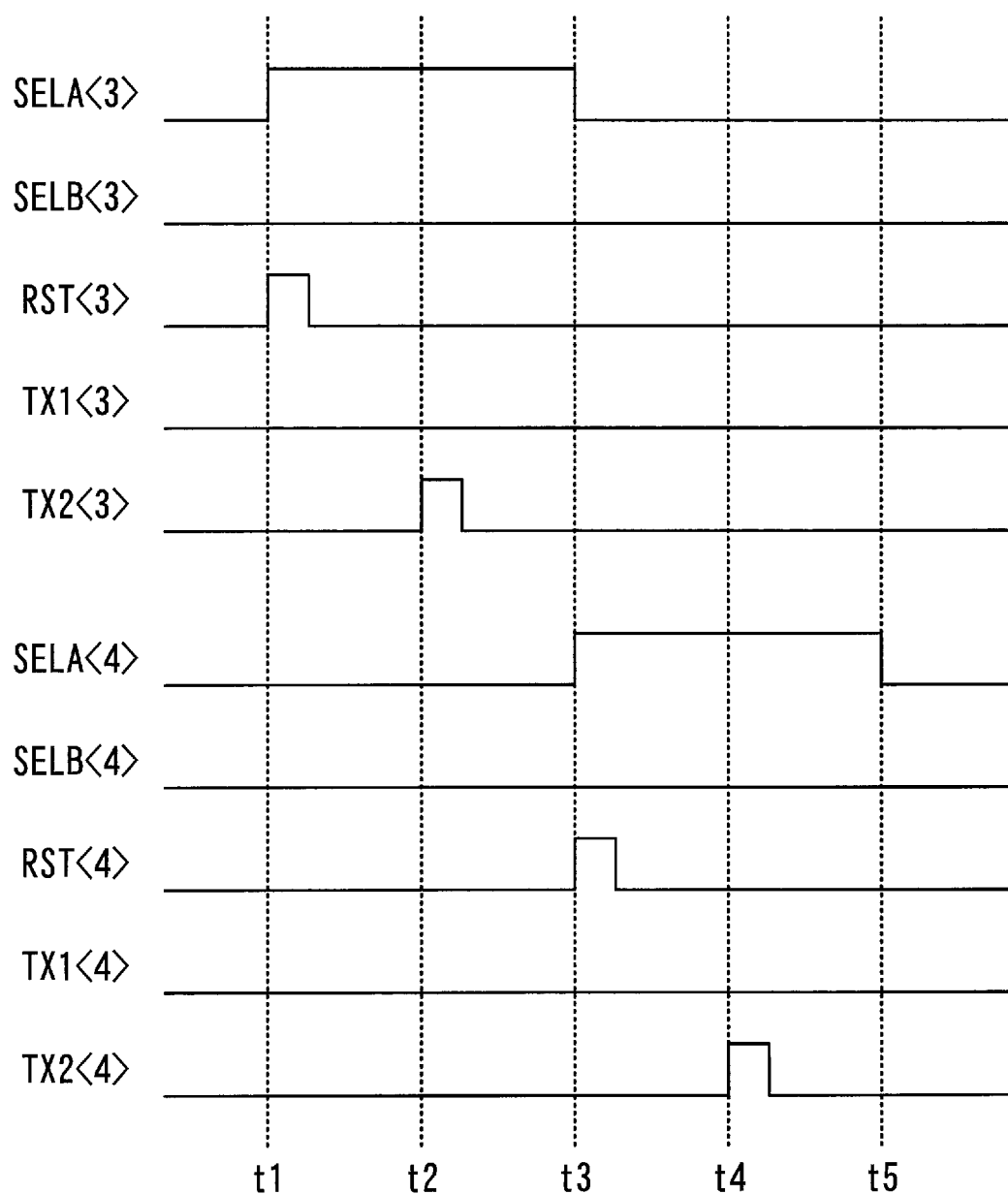
FIG. 8 is a timing chart showing yet another operation example of the image sensor according to the first embodiment.

FIG. 8 is a timing chart showing an example of the third readout control of the image sensor 3 according to the first embodiment. In the timing chart shown in FIG. 8, the horizontal axis indicates the time, indicates the control signal input to each part of the image sensor 3 of FIG. 6 in the third readout control.

At the time t1 shown in FIG. 8, upon the signal RST <3> becoming high level, the electric charge of the capacitor C of the FD 15 shared by the G pixel 10*g* (7, 2) in the 7th row and the first AF pixel 13*a* (8, 2) in the 8th row is reset. Further, at time t1, upon becoming high level the signal SELA <3>, the reset signal of the first AF pixel 13*a* (8, 2) is output to the first vertical signal line VoutA.

At the time t2, upon becoming high level the signal TX2 <3>, in the first AF pixel 13*a* (8, 2) in the 8th row, the electric charge photoelectrically converted by the photoelectric conversion unit 11*b* is transferred to the FD 15. Further, at the time t2, since the signal SELA<3> is at high level, the pixel signal of the first AF pixel 13*a* (8, 2) is output to the first vertical signal line VoutA.

At the time t3, upon becoming high level the signal RST <4>, the electric charge of the capacitor C of the FD 15 shared by the G pixel 10*g* (15, 2) in the 15th row and the second AF pixel 13*b* (16, 2) in 16th row is reset. Further, at the time t3, since the signal SELA<4> is at high level, the reset signal of the second AF pixel 13*b* (16, 2) is output to the first vertical signal line VoutA.

At the time t4, upon becoming high level the signal TX2 <4>, in the second AF pixel 13*b* (16, 2) in the 16th row, the electric charge photoelectrically converted by the photoelectric conversion unit 11*b* is transferred to the FD 15. Further, At the time t4, since the signal SELA <4> is at high level, the pixel signal of the second AF pixel 13*b* (16, 2) is output to the first vertical signal line VoutA.

The reset signal and the pixel signal sequentially output to the first vertical signal line VoutA are converted to digital signals by the first readout unit 40*a*. The pixel signals converted to digital signals are output to the control unit 4 after signal processing such as correlated double sampling are performed.

As described above, the image sensor 3 according to the present embodiment can perform the first readout control, the second readout control, and the third readout control. The image sensor 3 can improve the accuracy of the signal of the imaging pixel by performing the first readout control. Further, the image sensor 3 can improve the readout speed of the AF pixel signal by performing the second readout control, and can improve the accuracy of the AF pixel signal by performing the third readout control.

According to the above-described embodiment, the following effects can be obtained.

(1) The image sensor 3 comprises: the first pixel (the AF pixel 13) and the second pixel (the AF pixel 13), provided in a first direction, each including the first photoelectric conversion unit (photoelectric conversion unit 11) that photoelectrically converts light to generate an electric charge and the light-shielding unit 43 that shields a part of light incident to the first photoelectric conversion unit and outputting a signal based on the electric charge generated by the first photoelectric conversion unit; the third pixel (the imaging pixel 10) and the fourth pixel (the imaging pixel 10), provided in the first direction, each including the second photoelectric conversion unit that photoelectrically converts light to generate an electric charge and outputting a signal based on the electric charge generated by the second photoelectric conversion unit; the first signal line (the first vertical signal line VoutA) and the second signal line (the second vertical signal line VoutB), provided in the first direction, to which the signal of any one of the first pixel, the second pixel, the third pixel and the fourth pixel is output; and the control unit (the vertical control unit 30) that performs the first control (the second readout control) in which a signal of the first pixel is output to the first signal line and a signal of the second pixel is output to the second signal line, and the second control (the first readout control) in which a signal of the third pixel and a signal of the fourth pixel are output to the first signal line or the second signal line. In the present embodiment, the vertical control unit 30 performs the first control (the second readout control) and the second control (the first readout control). The vertical control unit 30 can improve the accuracy of the signal of the imaging pixel by performing the second control, and can improve the readout speed of the signal of the AF pixel by performing the first control.

(2) The control unit (the vertical control unit 30) performs the third control (the third readout control) in which the signal of the first pixel and the signal of the second pixel are output to the first signal line or the second signal line. In the present embodiment, the vertical control unit 30 performs the third control (the third readout control). The vertical control unit 30 can improve the accuracy of the AF pixel signal by performing the third control.

The following variations are also within the scope of the present invention, and one or more of the variations can be combined with the above-described embodiment.

Variation 1

Figure 9:
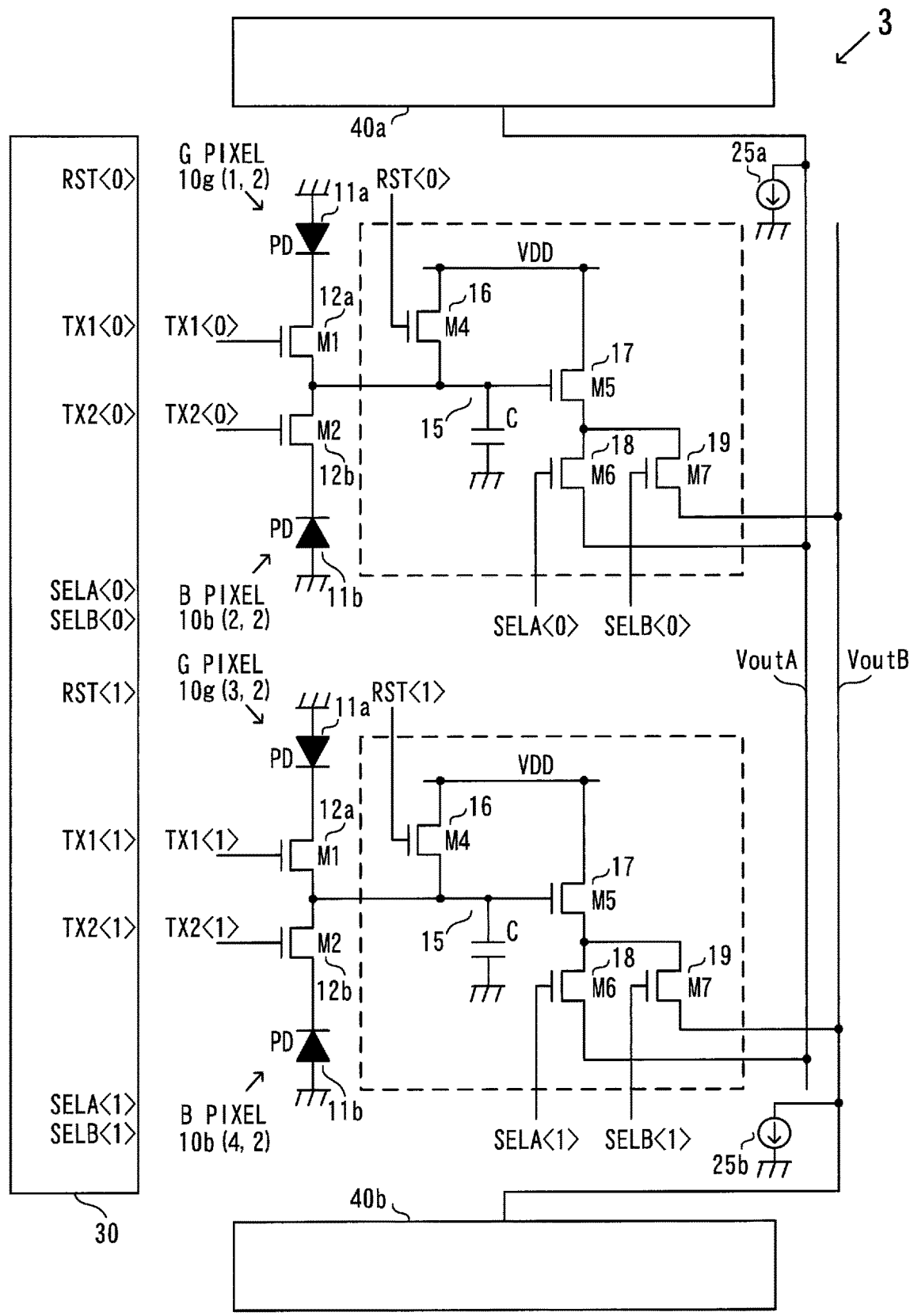
FIG. 9 is a diagram showing a configuration example of a part of an image sensor according to the variation 1.
Figure 10:
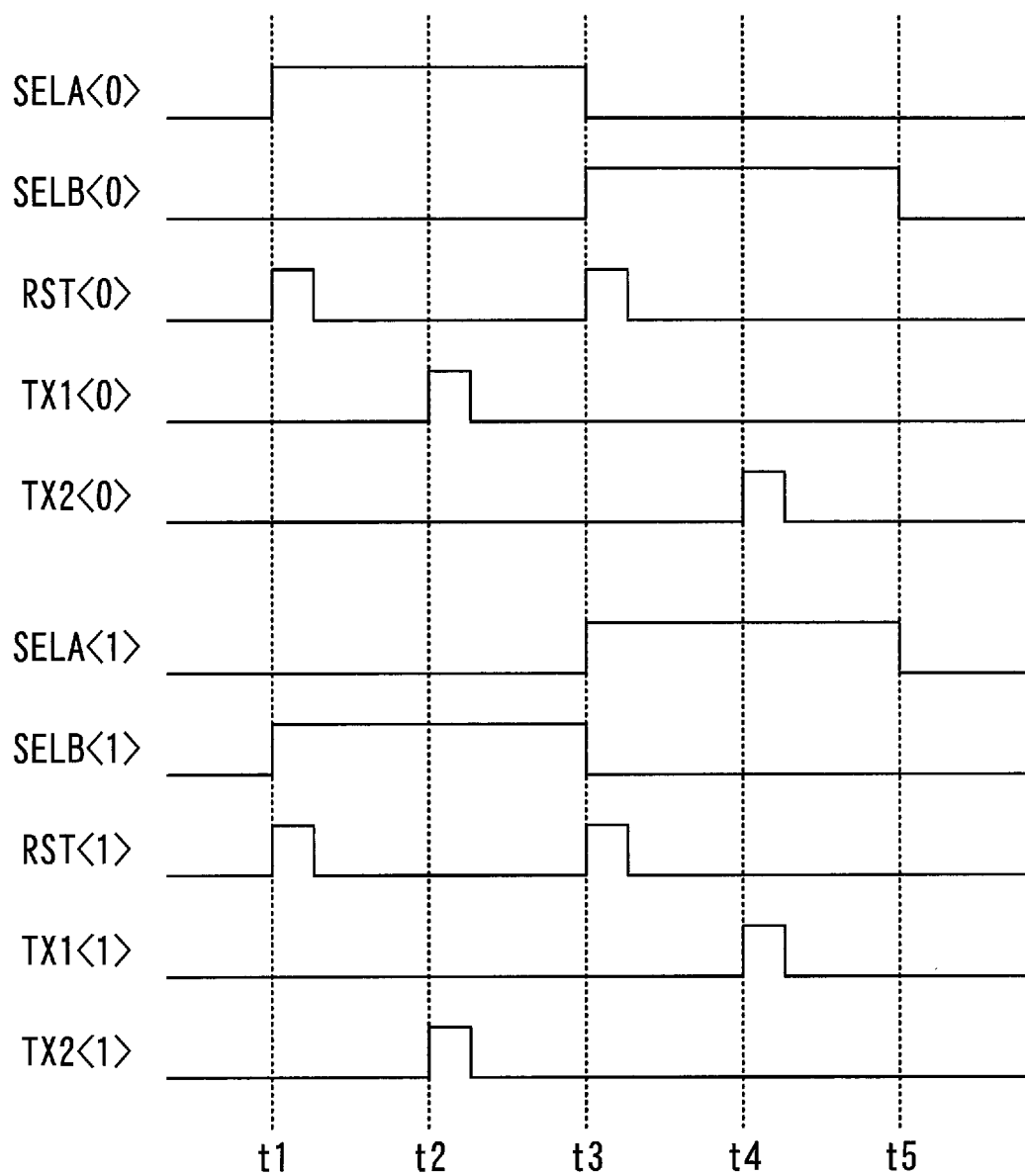
FIG. 10 is a timing chart showing an operation example of the image sensor according to the variation 1.

FIG. 9 is a diagram showing a configuration of a part of an image sensor according to the variation 1, and FIG. 10 is a timing chart showing one example of the first readout control of the image sensor according to the variation 1. It is to be noted that, in the example shown in FIG. 9, for simplification of the description, only 1 pixel in the row direction×4 pixels in the column direction are shown. In FIG. 9, among the plurality of pixels shown in FIG. 2, the G pixel 10g (1, 2) in the 1st row and 2nd column, the B pixel 10b (2, 2) in the 2nd row and 2nd column, the G pixel 10g (3, 2) in the 3rd row and 2nd column, and the B pixel 10b (4, 2) in the 4th row and 2nd column are illustrated. Hereinafter, the first readout control of the image sensor according to the variation 1 will be described with reference to FIG. 9 and FIG. 10.

At the time t1 shown in FIG. 10, the signal RST <0> and the signal RST <1> become high level. Upon the signal RST <0> becoming high level, the electric charge of the capacitor C of the FD 15 shared by the G pixel 10g (1, 2) and the B pixel 10b (2, 2) is reset.

Further, upon the signal RST <1> becoming high level, the electric charge of the capacitor C of the FD 15 shared by the G pixel 10g (3, 2) and the B pixel 10b (4, 2) is reset.

Further, at the time t1, the signal SELA <0> and the signal SELB <1> become high level. Upon becoming high level the signal SELA <0>, the reset signal of the G pixel 10g (1, 2) is output to the first vertical signal line VoutA by the amplification unit 17 and the first selection unit 18 of the G pixel 10g (1, 2).

Further, upon becoming high level the signal SELB <1>, the reset signal of the B pixel 10b (4, 2) is output to the second vertical signal line VoutB by the amplification unit 17 and the second selection unit 19 of the B pixel 10b (4, 2).

In this way, respectively to the first vertical signal line VoutA and the second vertical signal line VoutB, the reset signal from the G pixel 10g (1,2) in the 1st row and the reset signal from the B pixel 10b (4,2) in the 4th row are output at the same time. The reset signals output to the first vertical signal line VoutA and the second vertical signal line VoutB are input to the first readout unit 40a and the second readout unit 40b, respectively, and converted to digital signals.

At the time t2, the signal TX1 <0> and the signal TX2 <1> become high level. Upon becoming high level the signal TX1 <0>, in the G pixel 10g (1, 2), the electric charge photoelectrically converted by the photoelectric conversion unit 11a is transferred to the FD 15. Further, upon the signal TX 2<1> becoming high level, in the B pixel 10b (4, 2), the electric charge photoelectrically converted by the photoelectric conversion unit 11b is transferred to the FD 15.

At time t2, since the signal SELA <0> is at high level, the pixel signal of the G pixel 10g (1, 2) is output to the first vertical signal line VoutA. Further, since the signal SELB <1> is at high level, the pixel signal of the B pixel 10b (4, 2) is output to the second vertical signal line VoutB.

In this way, respectively to the first vertical signal line VoutA and the second vertical signal line VoutB, the pixel signal of the G pixel 10g (1, 2) in the 1st row and the pixel signal of the B pixel 10b (4, 2) in the 4th row are output at the same time. The pixel signals respectively output to the first vertical signal line VoutA and the second vertical signal line VoutB are respectively input to the first readout unit 40a and the second readout unit 40b, and converted to digital signals. The pixel signals converted to digital signals are output to the control unit 4 after signal processing such as correlated double sampling are performed.

At the time t3, the signal RST <0> and the signal RST <1> become high level. Upon becoming high level the signal RST <0>, the electric charge of the capacitor C of the FD 15 shared by the G pixel 10g (1, 2) and the B pixel 10b (2, 2) is reset.

Further, upon becoming high level the signal RST <1>, the electric charge of the capacitor C of the FD 15 shared by the G pixel 10g (3, 2) and the B pixel 10b (4, 2) is reset.

At the time t3, the signal SELB <0> and the signal SELA <1> become high level. Upon becoming high level the signal SELB <0>, the reset signal of the B pixel 10b (2, 2) is output to the second vertical signal line VoutB. Further, upon becoming high level the signal SELA <1>, the reset signal of the G pixel 10g (3, 2) is output to the first vertical signal line VoutA.

In this way, respectively to the first vertical signal line VoutA and the second vertical signal line VoutB, the reset signals of the G pixel 10g (3, 2) in the 3rd row and the B pixel 10b (2, 2) in the 2nd row are output at the same time. The reset signals respectively output to the first vertical signal line VoutA and the second vertical signal line VoutB are respectively input to the first readout unit 40a and the second readout unit 40b, and converted to digital signals.

At the time t4, the signal TX2 <0> and the signal TX1 <1> become high level. Upon becoming high level the signal TX2 <0>, in the B pixel 10b (2, 2), the electric charge photoelectrically converted by the photoelectric conversion unit 11b is transferred to the FD 15. Further, upon becoming high level the signal TX1 <1>, in the G pixel 10g (3, 2), the electric charge photoelectrically converted by the photoelectric conversion unit 11a is transferred to the FD 15. At the time t4, since the signal SELB <0> is at high level, the pixel signal of the B pixel 10b (2, 2) is output to the second vertical signal line VoutB. Further, since the signal SELA <1> is at high level, the pixel signal of the G pixel 10 g (3, 2) is output to the first vertical signal line VoutA.

In this way, respectively to the first vertical signal line VoutA and the second vertical signal line VoutB, the pixel signals from the G pixel 10g (3,2) in the 3rd row and the B pixel 10b (2,2) in the 2nd row are output at the same time. The pixel signals respectively output to the first vertical signal line VoutA and the second vertical signal line VoutB are respectively input to the first readout unit 40a and the second readout unit 40b, and converted to digital signals. The pixel signals converted to digital signals are output to the control unit 4 after signal processing such as correlated double sampling are performed.

In the period after the time t5, as in the same manner as in the period from the time t1 to the time t5, the imaging pixel rows are selected in units of two rows and readout of the reset signal and readout of the pixel signal are performed. As described above, also in the first readout control according to the variation 1, as the same as above-described embodiment, it is possible to select the imaged pixel rows in units of two rows and read out the pixel signals in units of a plurality of rows simultaneously. Further, the pixel signals of the same color pixels in the same row can be read out to the common readout unit 40, and the difference in the pixel signals due to the variation in the characteristics of each readout unit 40 can be suppressed.

Variation 2

In the first embodiment described above, an example in which two adjacent pixels share the FD 15 or the like has been described, but the pixel configuration is not limited to this. For example, each of the plurality of pixels provided in the image sensor 3 may be configured to have the FD 15, the reset unit 16, the amplification unit 17, the first selection unit 18, and the second selection unit 19. Moreover, the FD 15 and the like may be shared by three pixels or more. For example, the FD 15 or the like may be shared by four pixels.

Figure 11:
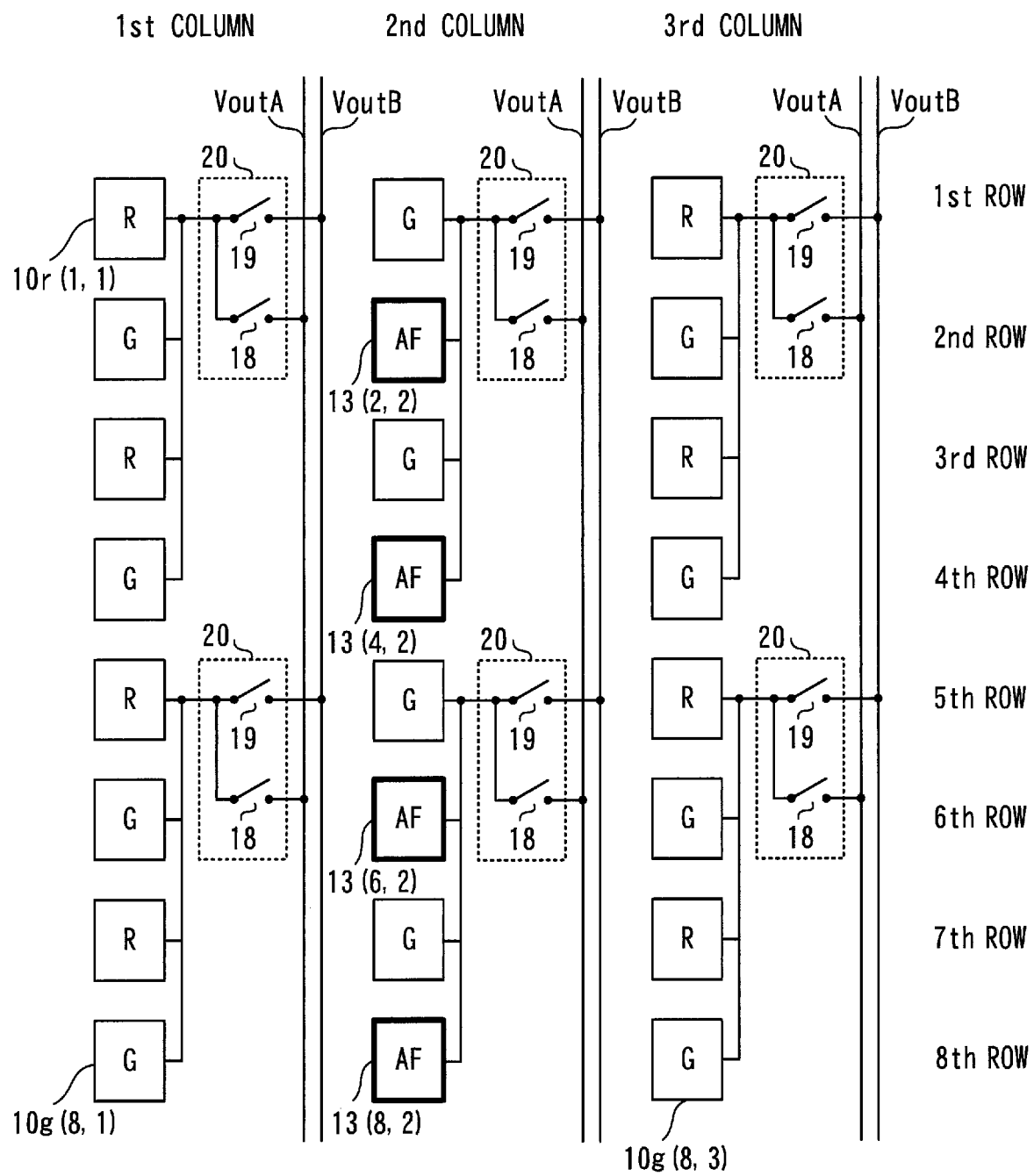
FIG. 11 is a diagram showing a configuration example of a part of an image sensor according to the variation 2.

FIG. 11 is a diagram showing a configuration example of an image sensor in a case the FD 15 and the like are shared by four pixels. In FIG. 11, the pixel in the upper left corner is the imaging pixel 10 (1, 1) in the 1st row and 1st column, and the pixel in the lower right corner is the imaging pixel 10 (8, 3) in the 8th row and 3rd column, that is twenty four pixels from imaging pixel 10 (1, 1) to imaging pixel 10 (8, 3) are illustrated in FIG. 11.

In FIG. 11, each dotted line 20 schematically shows that the four pixels share the FD 15, the reset unit 16, the amplification unit 17, the first selection unit 18, and the second selection unit 19. Further, the AF pixel 13 shown in FIG. 11 is the first AF pixel 13a or the second AF pixel 13b described above. The AF pixel 13 (2, 2) shares the FD 15 and the like with the AF pixel 13 (4, 2), and the AF pixel 13 (6, 2) shares the FD 15 and the like with the AF pixel 13 (8, 2).

In the third readout control, the vertical control unit 30 according to the present variation sequentially selects, for example, AF pixel 13 (2,2), AF pixel 13 (4,2), AF pixel 13 (6,2), AF pixel 13 (8, 2), and reads out signals thereof. Further, in the second readout control, the vertical control unit 30 selects AF pixel 13 (2, 2) or AF pixel 13 (4, 2) and outputs the pixel signals thereof to the first vertical signal line VoutA (or the second vertical signal line VoutB). At the same time as this reading out, the vertical control unit selects the AF pixel 13 (6, 2) or the AF pixel 13 (8, 2) and outputs the pixel signal thereof to the second vertical signal line VoutB (or the first vertical signal line VoutA). Therefore, even in a case if a plurality of AF pixels share the FD 15 or the like, the signal can be read out from each AF pixel 13 at high speed.

Variation 3

In the above-described embodiment, an example in which the first vertical signal line VoutA and the second vertical signal line VoutB are arranged as the vertical signal line, has been explained, however the present invention is not limited to this. For example, three or more vertical signal lines may be arranged. If the number of vertical signal lines increases, the pixel signal of the AF pixel 13 can be read out at a higher speed.

Variation 4

In the above-described embodiment, an example in which the G color filter 41 is arranged in the AF pixel 13 has been explained, however the present invention is not limited to this. For example, as the color filter 41, a W (white) color filter or a B color filter may be arranged in the AF pixel 13.

Variation 5

In the above-described embodiment, the case where the primary color system (RGB) color filter is used for the image sensor 3 has been explained, however the complementary color system (CMY) color filter may be used.

Variation 6

In the above-described embodiments and variations, an example in which a photodiode is used as the photoelectric conversion unit has been explained. However, a photoelectric conversion film may be used as the photoelectric conversion unit.

Variation 7

The image sensor 3 described in the above-described embodiment and variations may be applied to a camera, a smartphone, a tablet, a camera built in a PC, an in-vehicle camera, a camera mounted on an unmanned aerial vehicle (drone, radio-controlled airplane, etc.), and the like.

Variation 8

The image sensor in the above-described embodiment and variations may be applied to a stacked sensor (stacked image sensor) configured by stacking a plurality of substrates (for example, a plurality of semiconductor substrates). For example, the pixel unit 100 is arranged on the first layer substrate, the vertical control unit 30 and the readout unit 40 are arranged on the second layer substrate, and the vertical signal line Vout is arranged between the first layer substrate and the second layer substrate. The pixel unit 100 and the vertical control unit 30 may be arranged on the first layer substrate, and the reading unit 40 may be arranged on the second layer substrate. Further, the stacked sensor may have three or more layers.

Although various embodiments and variations have been described above, the present invention is not limited to these contents. Other aspects conceivable within the scope of the technical idea of the present invention are also included within the scope of the present invention.

The disclosure of the following priority application is herein incorporated by reference:

Japanese Patent Application No. 2018-67700 filed Mar. 30, 2018.

REFERENCE SIGNS LIST

3 . . . Image Sensor, 4 . . . Control Unit, 10 . . . Imaging Pixel, 13a . . . First AF Pixel, 13b . . . Second AF Pixel, 30 . . . Vertical Control Unit, 40a . . . First Readout Unit, 40b . . . Second Readout Unit.

The invention claimed is:

1. An image sensor, comprising:
a first pixel and a second pixel, provided in a first direction, each including a first photoelectric conversion unit that photoelectrically converts light to generate an electric charge and a light-shielding unit that shields a part of light incident to the first photoelectric conversion unit and outputting a signal based on the electric charge generated by the first photoelectric conversion unit;
a third pixel and a fourth pixel, provided in the first direction, each including a second photoelectric conversion unit that photoelectrically converts light to generate an electric charge and outputting a signal based on the electric charge generated by the second photoelectric conversion unit;
a first signal line and a second signal line, provided in the first direction, each of which can be connected to the first pixel, the second pixel, the third pixel and the fourth pixel; and a control unit that performs a first control in which a signal of the first pixel is output to the first signal line and a signal of the second pixel is output to the second signal line, and a second control in which a signal of the third pixel and a signal of the fourth pixel are output to the first signal line.

2. The image sensor according to claim 1, wherein:
each of the first pixel and the second pixel outputs a signal used for a focus detection; and
each of the third pixel and the fourth pixel outputs a signal used for generation of an image.

3. The image sensor according to claim 1, wherein:
the control unit, in the first control, outputs the signal of the second pixel to the second signal line while outputting the signal of the first pixel to the first signal line.

4. The image sensor according to claim 1, wherein:
the control unit, in the first control, outputs the signal of the second pixel to the second signal line at the same time as outputting the signal of the first pixel to the first signal line.

5. The image sensor according to claim 1, wherein:
the control unit, in the second control, outputs the signal of the fourth pixel to the first signal line or the second signal line after outputting the signal of the third pixel.

6. The image sensor according to claim 1, wherein:
the control unit performs the first control and the second control in different timing.

7. The image sensor according to claim 1, wherein:
the control unit performs the first control before performing the second control.

8. The image sensor according to claim 1, wherein:
the control unit, in the first control, outputs the signal of the first pixel to the first direction and outputs the signal of the second pixel to a second direction different from the first direction.

9. The image sensor according to claim 8, wherein:
the control unit, in the second control, outputs the signal of the third pixel and the signal of the fourth pixel to the first direction.

10. The image sensor according to claim 1, wherein:
the control unit performs a third control in which the signal of the first pixel and the signal of the second pixel are output to the first signal line or the second signal line.

11. The image sensor according to claim 10, wherein:
the control unit, in the third control, outputs the signal of the first pixel and the signal of the second pixel to the first signal line or the second signal line sequentially.

12. The image sensor according to claim 10, wherein:
the control unit can switch between the first control and the third control.

13. The image sensor according to claim 1, wherein:
the first pixel, the second pixel, the third pixel, and the fourth pixel each include a first filter having a first spectral characteristics; and
the first photoelectric conversion unit and the second photoelectric conversion unit each photoelectrically convert a light transmitted through the first filter.

14. The image sensor according to claim 13, further comprising:
a fifth pixel including a second filter having a second spectral characteristics different from the first spectral characteristics and a third photoelectric conversion unit that photoelectrically converts a light transmitted through the second filter to generate an electric charge, and outputting a signal based on the electric charge generated by the third photoelectric conversion unit, wherein:
the control unit, in the second control, outputs the signal of the third pixel to the first signal line and outputs the signal of the fifth pixel to the second signal line, or outputs the signal of the third pixel to the second signal line and outputs the signal of the fifth pixel to the first signal line.

15. The image sensor according to claim 14, wherein:
the control unit, in the second control, outputs the signal of the fifth pixel to the second signal line while outputting the signal of the third pixel to the first signal line, or outputs the signal of the fifth pixel to the first signal line while outputting the signal of the third pixel to the second signal line.

16. The image sensor according to claim 14, wherein:
the control unit, in the second control, outputs the signal of the fifth pixel to the second signal line at the same time as outputting the signal of the third pixel to the first signal line, or outputs the signal of the fifth pixel to the first signal line at the same time as outputting the signal of the third pixel to the second signal line.

17. The image sensor according to claim 1, further comprising:
a first readout unit that is connected to the first signal line and reads out a signal output to the first signal line; and
a second readout unit that is connected to the second signal line and reads out a signal output to the second signal line.

18. The image sensor according to claim 17, wherein:
the first readout unit is provided closer to the first pixel than to the second pixel with respect to the first direction; and
the second readout unit is provided closer to the second pixel than to the first pixel with respect to the first direction.

19. The image sensor according to claim 17, wherein:
each of the first readout unit and the second readout unit is a conversion unit that converts an analog signal to a digital signal.

20. An imaging device, comprising:
the image sensor according to claim 1;
a detection unit that performs focus detection based on a signal of the first pixel and a signal of the second pixel; and
a generation unit that generates an image data based on a signal of the third pixel and a signal of the fourth pixel.

* * * * *